United States Patent [19]
Matsunaga et al.

[11] Patent Number: 5,212,398
[45] Date of Patent: May 18, 1993

[54] BIMOS STRUCTURE HAVING A PROTECTIVE DIODE

[75] Inventors: Taira Matsunaga, Yokohama; Bunshiro Yamaki, Fujisawa, both of Japan

[73] Assignee: Kabushiki Kaisha Toshiba, Kawasaki, Japan

[21] Appl. No.: 931,510

[22] Filed: Aug. 21, 1992

Related U.S. Application Data

[63] Continuation of Ser. No. 618,476, Nov. 27, 1990, abandoned.

[30] Foreign Application Priority Data

Nov. 30, 1989 [JP] Japan .................................. 1-310978

[51] Int. Cl.⁵ ...................... H01L 23/62; H01L 29/76; H01L 31/075
[52] U.S. Cl. .................................. 257/356; 257/378; 257/656
[58] Field of Search .................. 357/13, 13 LM, 23.13, 357/41, 43

[56] References Cited

U.S. PATENT DOCUMENTS

| | | | |
|---|---|---|---|
| 3,806,773 | 4/1974 | Watanabe | 357/23.13 |
| 4,451,839 | 5/1984 | Nelson | 357/13 |
| 4,601,760 | 7/1986 | Hemmah et al. | 357/13 |
| 4,652,895 | 3/1987 | Roskas | 357/13 |
| 4,757,276 | 7/1988 | Ishii et al. | |
| 4,928,157 | 5/1990 | Matsunaga et al. | |
| 4,935,800 | 6/1990 | Taguchi | 357/43 |

FOREIGN PATENT DOCUMENTS

| | | | |
|---|---|---|---|
| 0337482 | 10/1989 | European Pat. Off. | 357/23.13 |
| 54-128294 | 10/1979 | Japan | 357/13 LM |
| 57-196584 | 12/1982 | Japan | 357/13 |
| 61-225875 | 10/1986 | Japan | 357/13 |
| 1-171262 | 7/1989 | Japan | 357/23.13 |

Primary Examiner—Rolf Hille
Assistant Examiner—Steven Loke
Attorney, Agent, or Firm—Finnegan, Henderson, Farabow, Garrett and Dunner

[57] ABSTRACT

In an integrated circuit device including a bipolar transistor, MOSFET, and protective diode for the MOSFET, all formed over a semiconductor substrate, the protective diode for holding an adequate electrostatic breakdown voltage for a gate oxide layer of the MOSFET is provided by forming a second conductivity type buried area continuous with, and in contact with, a second conductivity type region at a boundary between the first conductivity type semiconductor substrate and a first conductivity type second semiconductor layer. By doing so, a substantive junction depth Xj is made deeper as a whole with respect to the second conductivity type region. It is, therefore, possible to obtain a protective diode of adequate electrostatic breakdown-voltage characteristic which does not adversely affect the operation of the MOSFET even if a relatively thin semiconductor layer is employed. The resultant integrated circuit device equipped with the aforementioned protective diode can reveal an improved high frequency characteristic.

7 Claims, 6 Drawing Sheets

BIMOS STRUCTURE HAVING A PROTECTIVE DIODE

This application is a continuation, of application Ser. No. 07/618,476, filed Nov. 27, 1990, now abandoned.

BACKGROUND OF THE INVENTION

1. Field of the Invention

This invention relates to an integrated circuit (IC) device and, in particular, to an IC device of a BiMOS structure having a protective diode. Further, this invention is applied to an analog linear circuit operating at a VHF and UHF band in a high frequency region of 100 MHz to 800 MHz.

2. Description of the Related Art

Figure 2:
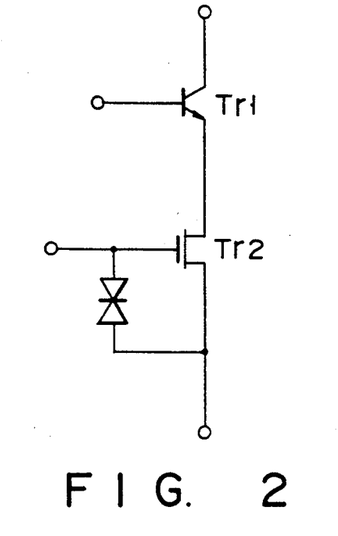
FIG. 2 is a circuit arrangement of a IC device.

FIG. 2 shows one form of circuit diagram showing a conventional IC device. The IC device includes a mixer as its portion. As evident from FIG. 2, a bipolar transistor and MOSFET for an MIS device are employed in the mixer. The emitter of the bipolar transistor is connected to the drain of a MOSFET (MOS field-effect transistor). In the device using such a bipolar transistor and MOSFET, a protective diode is usually connected between the source and the gate of the MOSFET so as to prevent a breakage of the MOSFET caused by an abnormal voltage applied to that gate.

Figure 1:
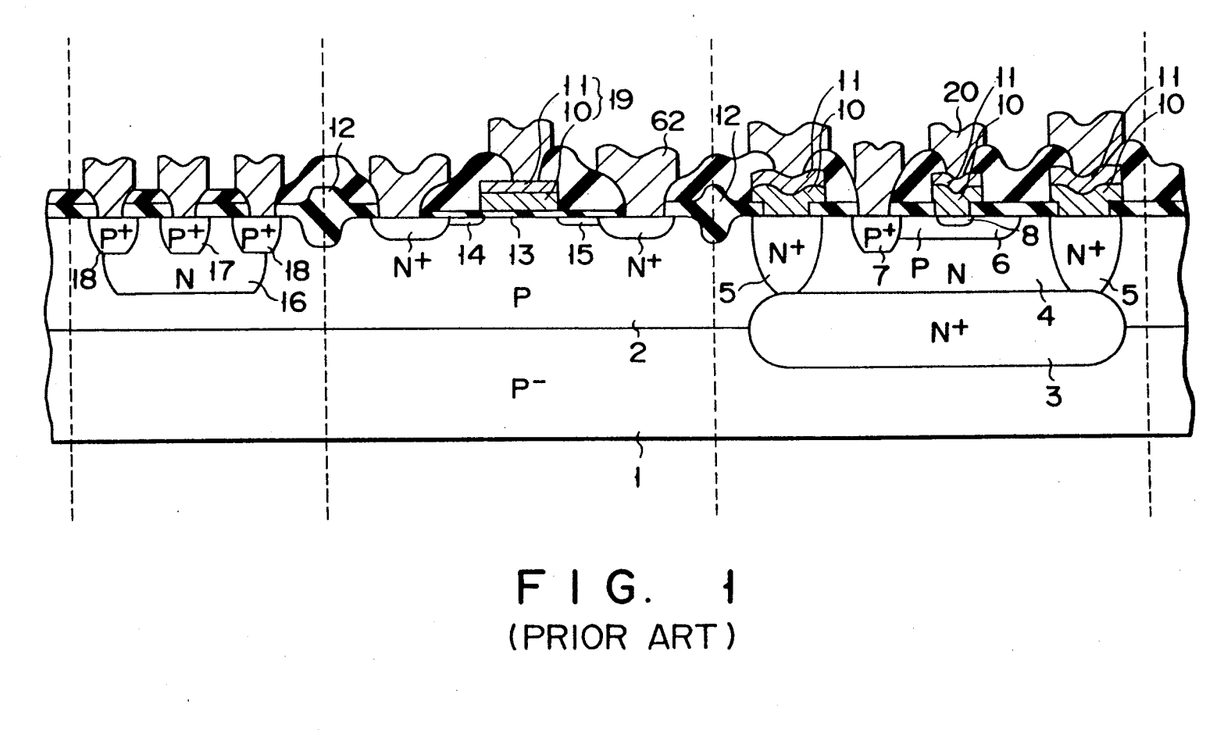
FIG. 1 is a cross-sectional view showing a structure of a conventional IC device.

FIG. 1 is a cross-sectional view showing a conventional semiconductor circuit device of a structure shown in FIG. 2. As evident from FIG. 1, a bipolar transistor and MOSFET are formed in and on a common semiconductor substrate. A first conductivity type epitaxial layer, that is, a second semiconductor layer 2 is deposited on the surface of a first conductivity type silicon semiconductor layer 1 that is, a semiconductor substrate and has an impurity concentration higher than that of the silicon semiconductor layer 1. Various parts are formed in and on the second semiconductor layer 2 to provide an IC (integrated circuit) device. The reason why the first semiconductor layer 1 is so formed as to have a lower impurity concentration than that of the first conductivity type second semiconductor layer 2 is that it is possible to reduce a capacitance between the collectors of bipolar transistors.

The semiconductor circuit device will be explained below in more detail. A buried area 3 is formed, by an ordinary method, at a predetermined place at a boundary between the first semiconductor layer 1 and a second semiconductor layer 2 and is of a second conductivity type having a high impurity concentration. That is, the N+ buried area 3 as set out above is completed by ion-implanting or diffusing Sb, a material exhibiting a second conductivity type, in the first semiconductor layer 1 at a predetermined place, depositing the second semiconductor layer 2 on the first semiconductor layer 1 and heat-treating the resultant structure to allow the Sb ion to be diffused in the first and second semiconductor layers at a predetermined place. A second conductivity type impurity is ion-implanted or diffused in the second semiconductor layer 2 at a location corresponding to the buried area 3 to provide a collector region 4 of a bipolar transistor and second conductivity type collector connection areas 5, 5 of low resistance.

A first conductivity type (P type) base region 6 is formed in a portion of the second conductivity type collector region 4 and a second conductivity type (N type) emitter region 8 is formed in the surface portion of the base region 6. It is to be noted that the second conductivity type emitter region 8 can be formed through the diffusion of impurities coming from an doped polycrystalline silicon layer 10 doped necessary impurities. A first conductivity type base connection area 7 of high impurity (P+) concentration is formed so as to lower an ohmic contact resistance and hence a base resistance. A molybdenum silicide layer 11 is provided on the doped polycrystalline silicon layer 10 and an Al electrode metal 20 is formed on the molybdenum silicide layer 11. The molybdenum silicide layer 11 permits ready connection to be made between the overlying Al electrode metal 20 and the doped polycrystalline silicon layer 10, enabling a connection resistance to be decreased and preventing a punch-through of aluminum. This type of bipolar transistor is well known in the art.

A MOSFET is formed adjacent the aforementioned bipolar transistor and a protective diode is monolithically formed adjacent the MOSFET. An isolation layer, that is, an LOCOS (local oxidation of silicon) layer 12 is provided between these devices.

A brief explanation of the aforementioned MOSFET being the same type as that of the known ones, will be given below.

Second conductivity type source and drain regions 14 and 15 are formed in the surface portions of the first conductivity type second semiconductor layer 2. A gate oxide layer 13 is formed on the surface of the second semiconductor layer 2 at an area corresponding to a channel region. A gate electrode 19 is provided on the gate oxide layer 13 and formed of a double layer comprised of a polycrystalline silicon layer 10 and molybdenum/silicide layer 11. A protective diode for preventing an electrostatic discharge damage of the gate oxide layer 13 for the MOSFET is constructed of second and third regions 17 and 18 of first conductivity type (P type) formed in a second conductivity type (N type) first region 16 and having a high impurity concentration, the first region 16 being formed on the surface portion of the first conductivity type second semiconductor layer 2.

Since the P+ type second region 17 and third regions 18 are provided in the N type first region to provide two diodes, these diodes are connected, cathode-to-cathode, in a series array. The second region 17 and third regions 18 are connected to the gate electrode 19 and source layer 14 in the MOSFET, respectively, as shown in FIG. 2, noting that this connection is not shown in FIG. 1. In this way, these two diodes are connected in parallel with a gate-to-source circuit of the MOSFET as shown in FIG. 2.

In order for the protective diode to exert no adverse effect on the operation of the MOSFET and to have an adequate protection capability for electrostatic discharge damage, the following characteristics are required for the protective diode:

(1) In order for the protective diode to exert no adverse effect on the normal operation of the MOSFET, the protective diode does not breakdown within a range of an input signal and has low leakage current.

(2) In order to prevent the damage of the MOSFET, the protective diode can breakdown with a smaller voltage than the breakdown voltage of the gate oxide layer.

Figure 5:
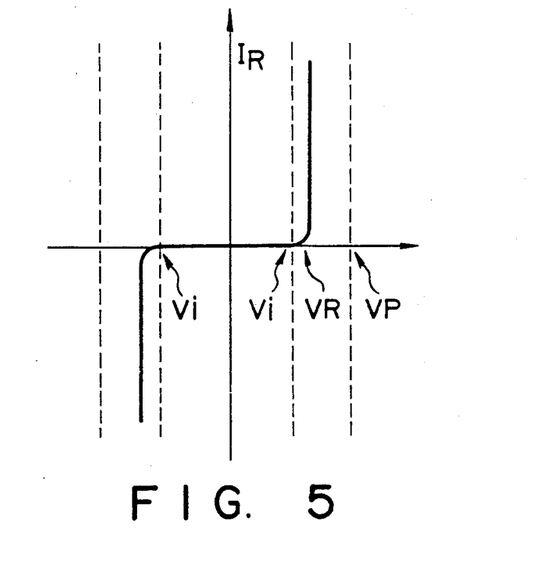
FIG. 5 is a graph showing characteristics required of a protective diode.

That is, a breakdown voltage $V_R$ of the protective diode needs to satisfy the following condition $$V_i < V_R < V_P$$

where $V_i$ and $V_p$ represent the maximum value of an input signal and electrostatic breakdown voltage of the gate oxide layer, respectively. This is indicated in a graph shown in FIG. 5.

In order to satisfy the aforementioned condition, it is necessary to optimize the impurity concentration of the second conductivity type first region 1 and the depth $X_j$ of diffusion. It is, therefore, necessary that, in order to satisfy the condition (1), the diffusion depth $X_j$ be made considerably great to an extent exceeding 3 μm. Since the second conductivity type first region 16 is formed through the ion implantation and diffusion process of the N type impurity, in order to set the diffusion depth $X_j$ to a level exceeding 3 μm, heat treatment has to be performed at a high temperature for a prolonged period of time, for example, at a temperature of 1200° C. for two hours. Since, with the thickness of the second conductivity type second semiconductor layer 2 conventionally set to be normally about 6 μm, heat treatment of 2 to 3 hours was needed at a high temperature necessary to the ion implantation and diffusion processes for the formation of the collector region 4, even if the heat treatment was performed at a high temperature for a prolonged period of time in the formation of the second conductivity type first region 16 in the diode, no adverse effect has not been exerted on the characteristics of the bipolar transistors.

In the integrated circuit formed by the aforementioned method, it is possible to obtain a bipolar transistor whose gain band/width product $f_T$ is 2 to 4 GHz. It is important that, in order to improve the characteristic of the high frequency wave in the IC device, the bipolar transistor must be improved in terms of its characteristics. It is thus necessary, in the IC device shown in FIG. 2, to decrease the parasitic capacitance between the semiconductor structure and the collector region. It is also necessary to decrease the thickness of the first conductivity type second semiconductor layer. For the formation of a transistor of $f_T = 7$ to 10 GHz, the allowable thickness of the second semiconductor layer is of the order of 2 μm.

With the second semiconductor layer smaller in thickness, for example, of the order of 2 μm, the heat treatment for forming the collector region is conducted at a diffusion temperature of 1100° C. for about 4 hours and, if this treatment exceeds that temperature, an impurity is thermally diffused from the second conductivity type buried area into the collector region and thus the impurity concentration of the collector region is increased, causing a fall in breakdown voltage and $f_T$ of the bipolar transistor. Since the second conductivity type first region of the diode is formed together with the collector region, the depth of a junction, $X_j$, becomes about 1.2 μm. Thus the breakdown voltage of the protective diode drops markedly down to 4 to 6 V, adversely affecting the normal operation of the MOSFET.

SUMMARY OF THE INVENTION

It is an object of the present invention to provide an IC device having a high frequency characteristic.

Another object of the present invention is to provide an IC device including a protective diode device which exhibits an excellent characteristic even if use is made of a relatively thin semiconductor layer.

According to the present invention, there is provided an integrated circuit device including a bipolar transistor, a metal-insulator semiconductor (MIS) device and a protective diode for the metal-insulator semiconductor device formed in a semiconductor layer of one conductivity type formed over a semiconductor substrate of high resistivity, the protective diode comprises:

(1) a first region formed in said semiconductor layer of one conductivity type and having an opposite conductivity type to that of said semiconductor layer;

(2) a buried area of a high impurity concentration formed continuous with, and in contact with, the first region, at a boundary between the lower portion of the first region and the semiconductor substrate, the buried area having the same conductivity type as that of the first region and (3) a plurality of regions adjacently formed, at the first region, in the surface portion of the semiconductor layer and having a conductivity type opposite to that of the first region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

The embodiments of the present invention will be explained below with reference to FIGS. 2 to 9.

The present invention will be explained below in conjunction with the manufacturing process of an IC device including a bipolar transistor and MIS device.

Figure 3:
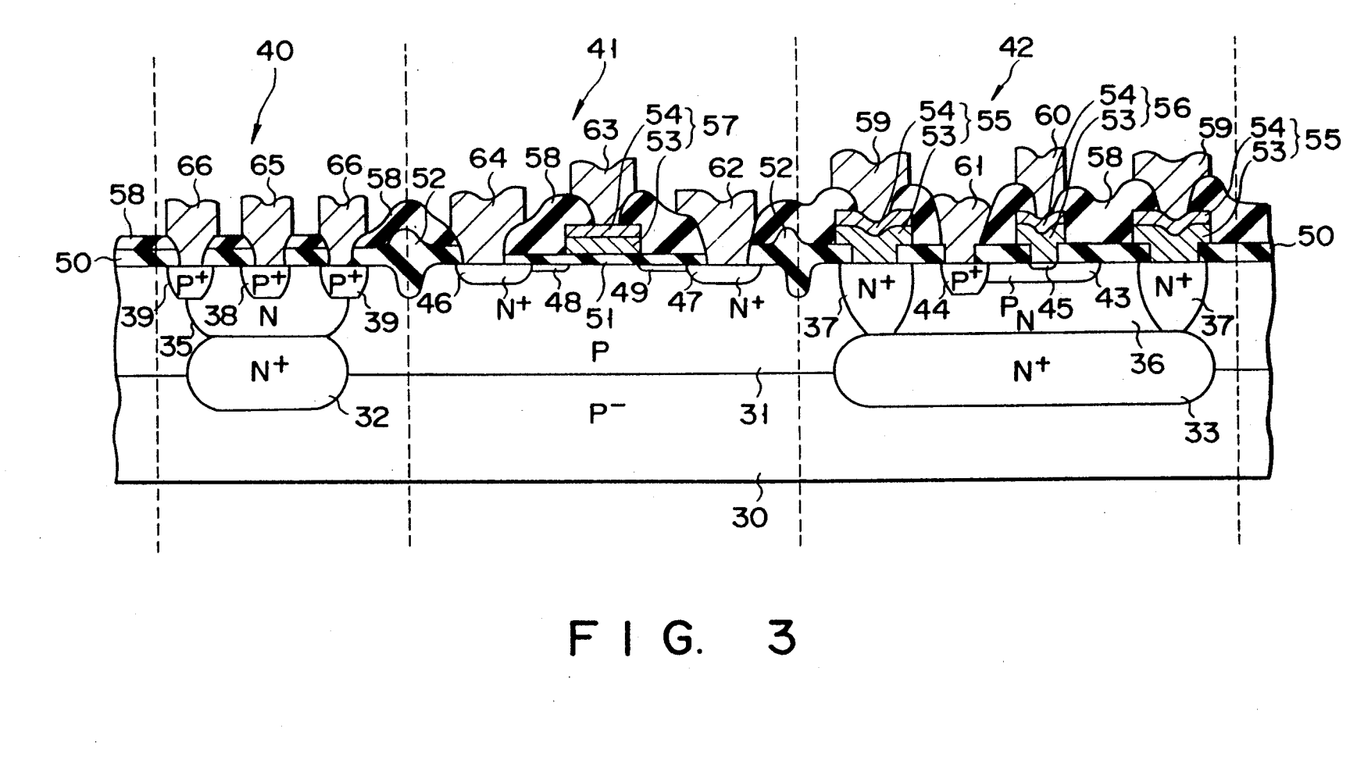
FIG. 3 is a cross-sectional view showing a structure of an IC device according to an embodiment of the present invention.

The IC device shown in FIG. 3, like the device as shown in FIG. 1, includes a bipolar transistor, MOSFET and protective diode. In the formation of second conductivity type (N type) buried areas 32 and 33 at the surface of a first conductivity type first semiconductor layer, that is a semiconductor substrate 30, having a boron (B) of about $8 \times 10^{14}/cm^3$, the first semiconductor layer is masked by photolithography technique except for those locations where a bipolar transistor and protective diode are formed. With the mask so formed, an Sb ion is diffused and/or implanted into a semiconductor structure at those locations corresponding to buried areas, that is, second conductivity type high impurity concentration areas or layers with Sb of about $5 \times 10^{19}/cm^3$, whereby buried area sources are formed. Then a first conductivity type second semiconductor layer 31, that is, an epitaxial layer with boron (B) of about $2 \times 10^{15}/cm^3$, is deposited on the resultant structure and, at the same time, the second conductivity type impurity is diffused, by a heat treatment, from the buried area sources corresponding to the locations where a bipolar transistor and protective diode are formed to form second conductivity type buried areas 32 and 33. A MOSFET and bipolar transistor are monolithically formed in and on the surface portion of the resultant semiconductor structure through the implantation and diffusion of an impurity ion from the surface of the first conductivity type second semiconductor layer 31.

Stated in more detail, a thermal oxidation film is formed, as known in the art, on the surface of the first conductivity type second semiconductor layer 31. Then openings are provided by photolithography technique in the thermal oxidation film at predetermined areas and a phosphorus ion is implanted into the resultant structure through the openings, forming a second region 36 functioning as a second conductivity type N type) collector region, collector connection areas 37, 37, and first region 35 acting as an N type area for a protective diode. In actual practice, these regions and area are formed by controlling an amount of impurity according to their concentration and performing a slumping step simultaneously, that is, under the condition of an acceleration voltage 70 KeV and dose of $1.9 \times 10^{12}/cm^2$, 70 KeV and $2.0 \times 10^{15}/cm^2$, and 70 KeV and $2.0 \times 10^{13}/cm^2$, respectively, in that order in which case the slumping step is performed for about three hours in a nitrogen atmosphere kept at 1100° C.

The ion implanting process may be performed under the same condition in the formation of the second conductivity type second region 36, that is the collector region for a bipolar transistor, and second conductivity type first region 35 for a protective diode, but it is preferable to perform the ion implantation process under conditions optimal to the characteristics of respective devices to be formed. A selective oxide layers 52 are formed, as a 10000 Å-thick separation oxide layer, by a known means at a predetermined location between the protective diode and a MOSFET and that between the MOSFET and the bipolar transistor, completing a protective diode section 40 including the buried area 32 at the location corresponding to a protective diode formation area, MOSFET section 41, and bipolar transistor section 42 including the buried area 33 at the location corresponding to a bipolar transistor formation area. A 1000 Å-thick oxide layer 50 is formed over the protective diode section 40 including the buried area 32 and bipolar transistor area 42 including the buried area 33. Then, for example, a boron (B) ion is implanted in the resultant semiconductor structure under the condition of an acceleration voltage of 40 KeV and dose of $3.8 \times 10^{15}/cm^2$ and heat treatment is conducted for 30 minutes in a nitrogen atmosphere kept at 1000° C., thus forming first conductivity type regions 38, 39 and a base connection are 44 for the bipolar transistor.

After an oxide film is removed from the MOSFET area 41, a resist pattern having openings at predetermined areas is formed over the resultant semiconductor structure. An arsenic (As) ion is implanted into the MOSFET area 41 under the condition of an acceleration voltage 40 KeV and dose of $5.0 \times 10^{15} cm^2$ to provide contact areas 46 and 47 for source and drain regions respectively. Another oxidation step is performed to provide a gate oxide layer 51 having a thickness of 500 Å. Further, a boron ion is implanted under the condition of an acceleration voltage of 40 keV and dose of $5.0 \times 10^{13}/cm^2$ and a resultant structure is heat treated in a nitrogen atmosphere of 800° C. to provide a first conductivity type region 43.

Then those oxide layers 50 corresponding to the emitter region formation area and collector electrode connection areas 37, 37 are removed from the semiconductor structure. As-doped polycrystalline silicon layers 53 and molybdenum silicide layers 54 are continuously deposited on the resultant structure and patterned to form a gate electrode 57, an emitter connection area 56 and a collector connection area 55. As will be set but below, an Al or Al alloy (Al-Si, Al-Si-Cu, etc.) is deposited over the semiconductor structure at a subsequent step to provide respective electrodes. The electrodes of such a multi-layer structure are prepared against a fall in contact resistance and a punch-through of Al.

After the formation of the gate electrode 57, a source region 48 and drain region 49 are formed under the condition that a phosphorus (P) ion is implanted at an acceleration voltage of 60 KeV and dose of $2.5 \times 10^{14}/cm^2$. An insulating interlayer 58 is formed of an about 8000 Å-thick silicon oxide layer deposited by a CVD (Chemical Vapor Deposition) method at a predetermined area. Then the silicon oxide layer is heat treated in an $N_2$ atmosphere kept at 930° C., thereby controling the current amplification factor $h_{FE}$ of the bipolar transistor. Wiring electrode 59 to 66 are deposited, and patterned, by a vapor deposition method or sputtering method using an Al or Al alloy (Al-Si, Al-Si-Cu, etc.) and this is done through openings which are lithographically formed in the insulating interlayer 58 at predetermined places, thereby making connections to the gate electrode 57 and source region 46 in the MOSFET and first conductivity type areas 38, 39 in the protective diode, that is, making connections to associated parts or areas as shown in FIG. 2. This completes an IC device as shown in FIG. 2.

In the integrated circuit arrangement thus accomplished, the N+buried area 32 is located below the first region 35 in the protective diode. If, therefore, the semiconductor layer 31 is made thinner so as to allow the circuit to be used under a high frequency wave, the N type first region 35 extends down as an apparently enlarged region due to the underlying buried area 32. Even if, therefore, the depth of diffusion is made shallower by a slumping step so as for the bipolar transistor to possess a proper characteristic, the N area in the protective diode can go adequately deeper, ensuring a desired characteristic for the protective diode.

Figure 4:
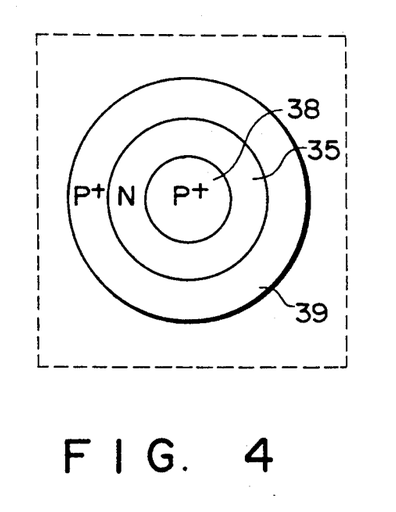
FIG. 4 is a plan view showing a protective diode shown in FIG. 3.

FIG. 4 shows one form of a plane pattern for the protective diode. Since the first conductivity type regions 38 and 39 and second conductivity type first region 35 are arranged in a concentric fashion, a distance is constant between the first conductivity type region 38 and the first conductivity type region 39, therefore preventing a local concentration of electric current and enhancing a withstand level for electrostatic discharge damage.

Figure 6:
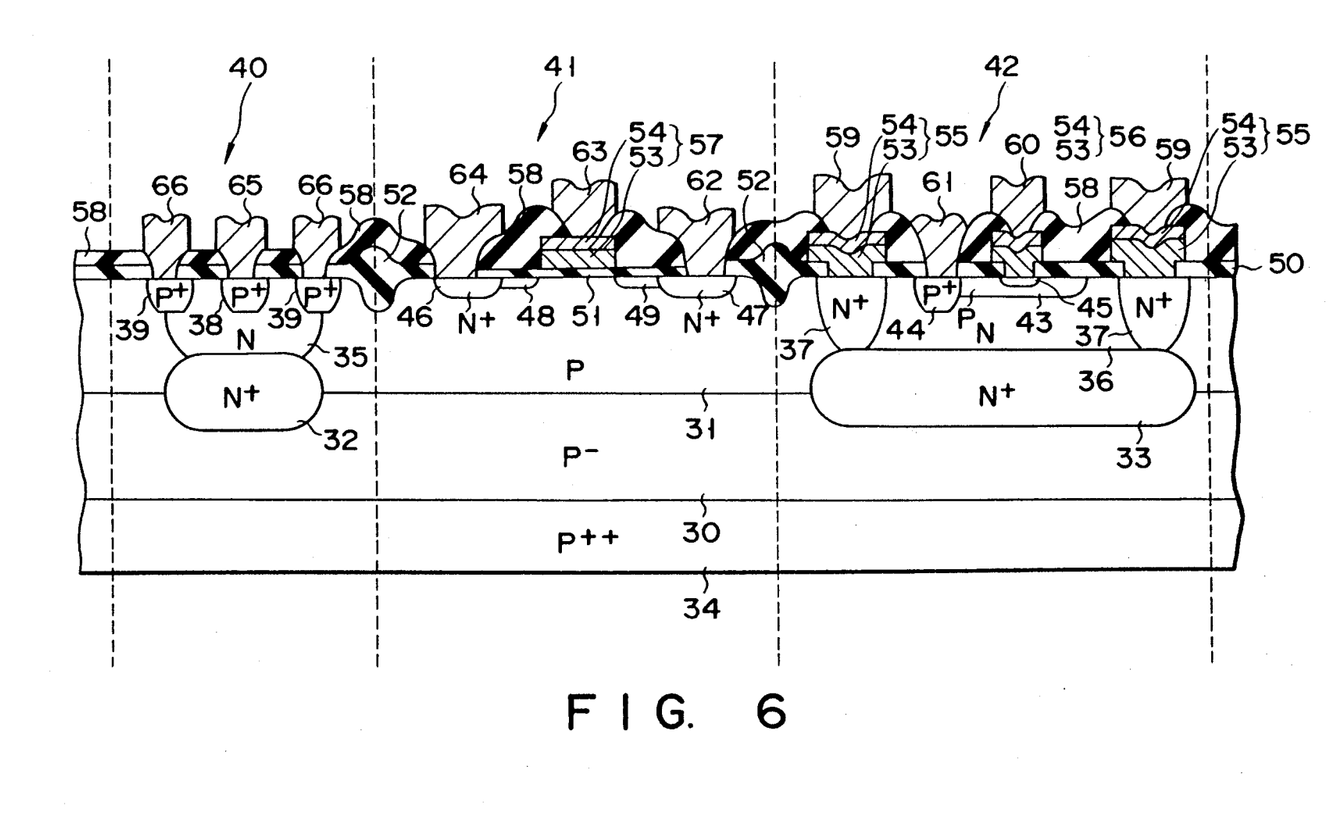
FIGS. 6 to 8, each, are a cross-sectional view showing a structure of an IC device according to another embodiment of the present invention.
Figure 7:
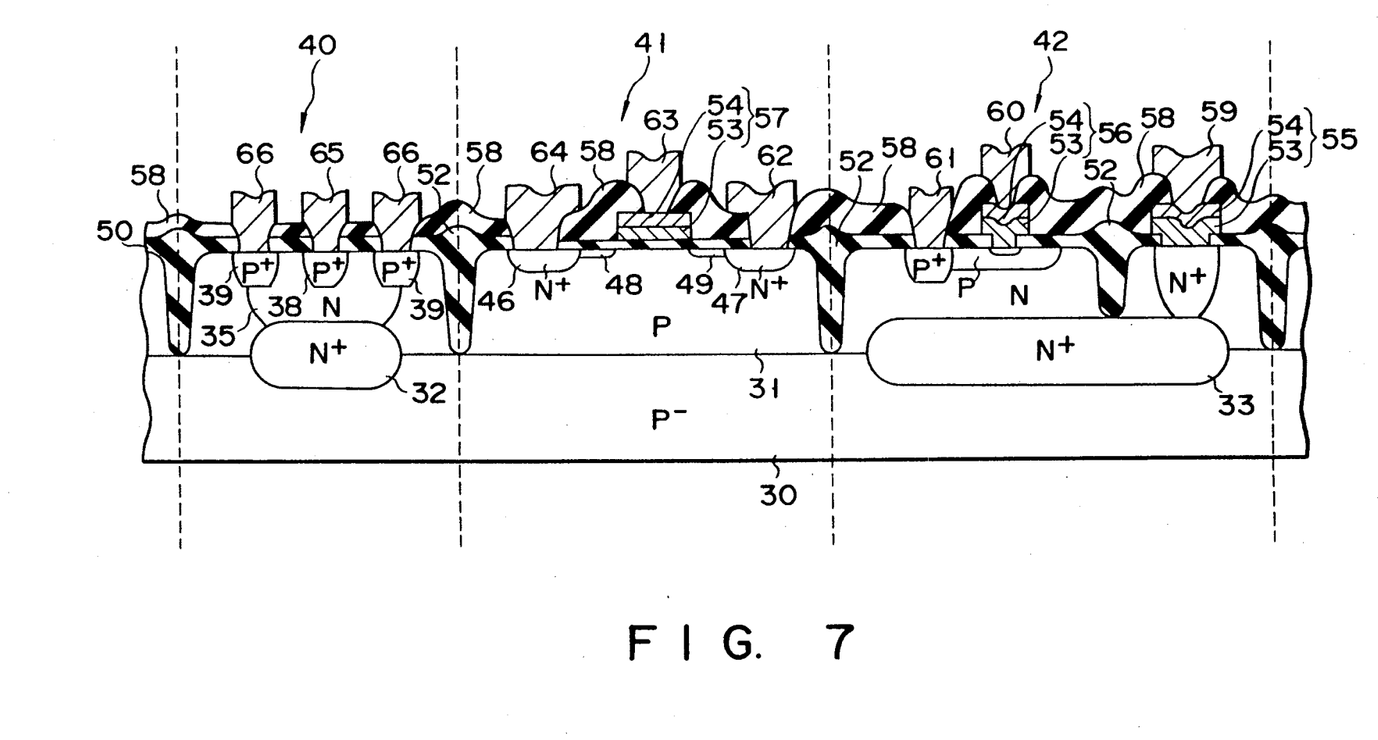
Figure 8:
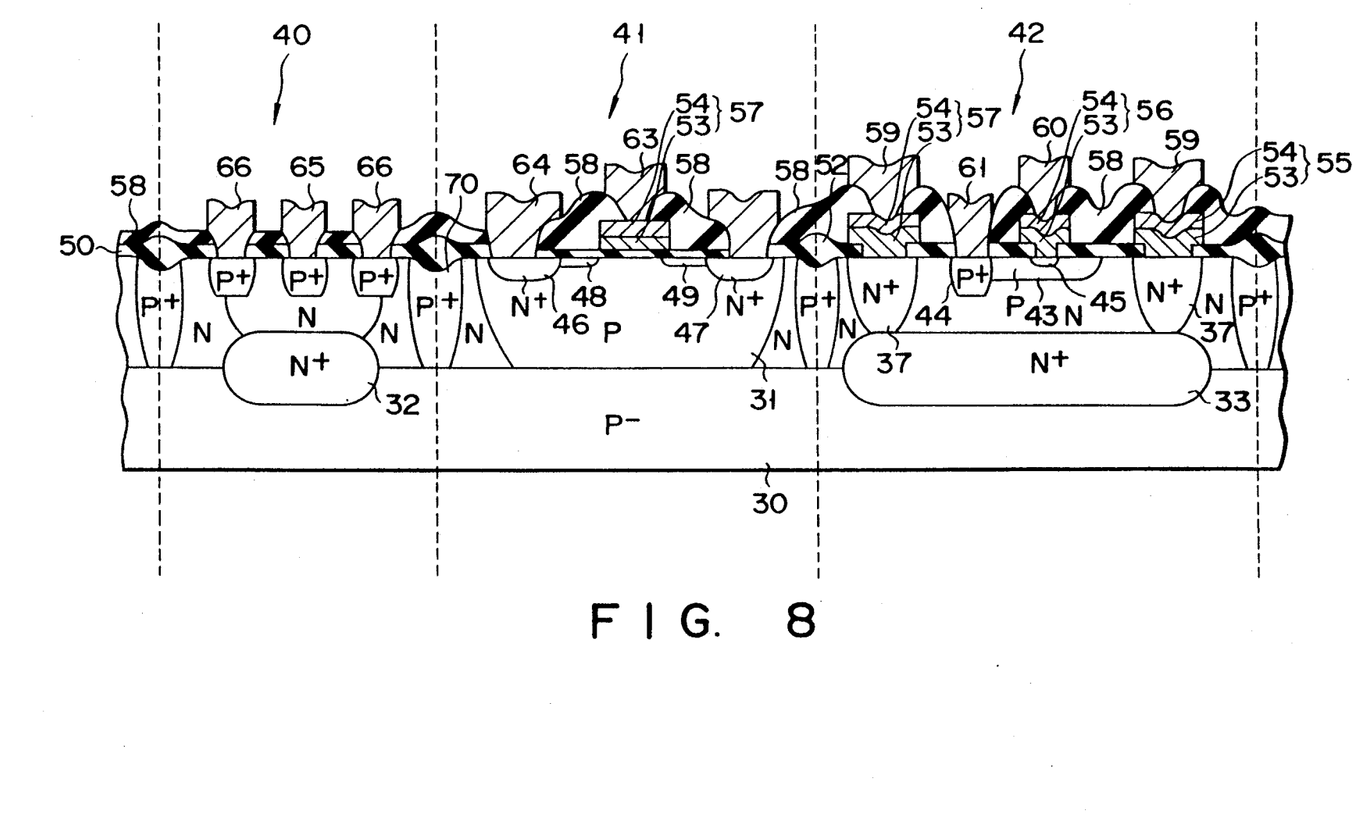

As shown in FIG. 6, a three-level composite semiconductor substrate can be provided, as a composite semiconductor layer structure, with a third semiconductor layer 34 so provided on the other surface of the first conductivity type first semiconductor layer 30 as to contain $1 \times 10^{19}/cm^3$ of boron (B). In FIG. 6, the same reference numerals are employed to designate parts or elements corresponding to those in FIG. 3. The arrangement of FIG. 6 is exactly the same as that of FIG. 3 except that the third semiconductor layer 34 is provided on the surface of the first semiconductor layer 30. As shown in FIG. 7, for example, respective device's areas can be separated by insulating materials 52 to which the present invention is equally applied. In an IC device shown in FIG. 8, respective elements may be isolated, by first conductivity type areas 70 of high impurity concentration, in a second conductivity type semiconductor layer which is deposited on a first conductivity type semiconductor substrate. The present invention can also be applied to the arrangement of FIG. 8. In FIGS. 6 to 8, exactly the same parts or elements as shown in FIG. 3 are employed except for the aforementioned sites and further explanation is, therefore, omitted.

Although, in the aforementioned semiconductor structures, the first and second conductivity types have been explained as being the P- and N-types, respectively, the present invention is not restricted thereto and opposite conductivity types may, of course, be employed in the semiconductor structure mentioned. Further, the first semiconductor layer may be initially made an N type in which case MOSFET is formed as a P type.

Figure 9:
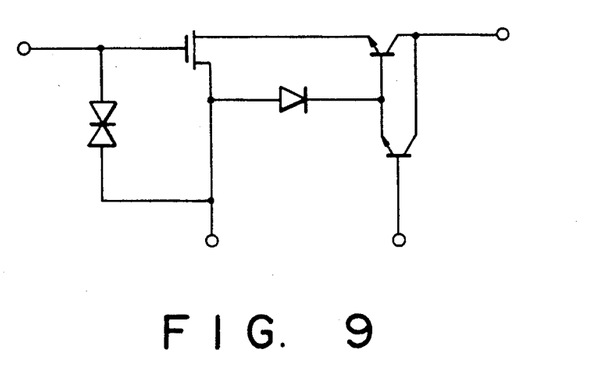
FIG. 9 is a circuit diagram showing the IC device according to another embodiment of the present invention.

The present invention is not restricted to the aforementioned embodiments and can also be applied to an IC device having a circuit shown in FIG. 9. The IC device according to the present invention can be equipped with a protective diode which exhibits an excellent characteristic even in the case where heat treatment is done at a low temperature for a short period of time so that a high frequency characteristic can be improved. For example, a junction depth $X_j$ of the second conduction type first region for the protective diode is about 1.2 μm, but, in view of the buried second conductivity type area is about 6.2 μm.

The breakdown voltage of the protective diode is about 11 V, a level which is great enough for an input signal. Tests were made for electrostatic discharge damage by charging and discharging an attached capacitor of 200 PF and it has been found that no breakage occurred up to 250 V.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An integrated circuit device including a bipolar transistor, a metal-insulator semiconductor (MIS) device and a protective diode for the metal-insulator semiconductor device formed in a first semiconductor layer of one conductivity type formed over a semiconductor substrate of high resistivity, the protective diode comprises:

(1) a first region of a first thickness formed in said first semiconductor layer and having an opposite conductivity type to that of said first semiconductor layer;

(2) a first buried area of a high impurity concentration formed continuous with, and in contact with, the first region, at a boundary between the lower portion of the first region and the semiconductor substrate, the first buried area having the same conductivity type as that of the first region, and the first buried area having a second thickness greater than said first thickness of said first region; and (3) a plurality of regions adjacently formed, at the first region, in a surface portion of the first semiconductor layer and having a conductivity type opposite to that of the first region.

2. The integrated circuit device according to claim 1, wherein at least one bipolar transistor comprises:

a second region formed in said one-conductivity type first semiconductor layer and having the same conductivity type as that of said first region;

at least one third region formed adjacent to the second region, being higher in impurity concentration than the second region; and a second buried area formed below the second and third regions and continuous with, and in contact with, the second region and third regions, the second buried area having the same conductivity type as that of the second region.

3. The integrated circuit device according to claim 2, wherein said first region of said protective diode and said second region of said bipolar transistor are maintained different in impurity concentration from each other.

4. The integrated circuit device according to claim 2, wherein a second semiconductor layer, the same in conductivity as, and higher in impurity concentration than, said semiconductor substrate is adjacently formed on a side opposite to that on which said one conductivity type first semiconductor layer is formed with said bipolar transistor, metal-insulator (MIS) device and protective diode provided thereon.

5. The integrated circuit device according to claim 2, wherein respective regions of a bipolar transistor, metal-insulator semiconductor (MIS) element and said protective diode for the MIS element all formed in said first semiconductor layer of one conductivity type formed over said semiconductor substrate of high resistivity are isolated as respective units by corresponding insulating materials.

6. The integrated circuit device according to claim 1, wherein a second semiconductor layer, the same in conductivity as, and higher in impurity concentration than, said semiconductor substrate is adjacently formed on a side opposite to that on which said conductivity type first semiconductor layer is formed with said bipolar transistor, metal-insulator (MIS) device and protective diode provided thereon.

7. The integrated circuit device according to claim 1, wherein respective regions of a bipolar transistor, metal-insulator semiconductor (MIS) element and said protective diode for the MIS element all formed in said first semiconductor layer of one conductivity type formed over said semiconductor substrate of high resistivity are isolated as respective units by corresponding insulating materials.

* * * * *